US006879017B2

(12) United States Patent
Ahn et al.

(10) Patent No.: US 6,879,017 B2
(45) Date of Patent: *Apr. 12, 2005

(54) METHODS AND STRUCTURES FOR METAL INTERCONNECTIONS IN INTEGRATED CIRCUITS

(75) Inventors: Kie Y. Ahn, Chappaqua, NY (US); Leonard Forbes, Corvallis, OR (US); Paul A. Farrar, So. Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 33 days.

This patent is subject to a terminal disclaimer.

(21) Appl. No.: 10/338,178

(22) Filed: Jan. 7, 2003

(65) Prior Publication Data

US 2003/0209775 A1 Nov. 13, 2003

Related U.S. Application Data

(60) Continuation of application No. 09/651,471, filed on Aug. 30, 2000, now Pat. No. 6,504,224, which is a division of application No. 09/030,430, filed on Feb. 25, 1998, now Pat. No. 6,121,126.

(51) Int. Cl.[7] .............................................. H01L 29/00
(52) U.S. Cl. ....................... 257/508; 257/758; 257/741; 257/742; 257/761; 257/19; 257/616; 257/503; 257/734
(58) Field of Search ................... 257/508, 758, 257/741, 742, 761, 19, 616, 503, 734, 763

(56) References Cited

U.S. PATENT DOCUMENTS

| 3,571,674 A | 3/1971 | Yu et al. ..................... 317/235 |
| 3,932,226 A | 1/1976 | Klatskin et al. .............. 204/16 |
| 4,157,269 A | 6/1979 | Ning et al. ................... 148/1.5 |

(Continued)

FOREIGN PATENT DOCUMENTS

| JP | 03-222367 | 10/1991 | ......... H01L/29/784 |
| JP | 05-062925 | 3/1993 | ........... H01L/21/28 |
| JP | 06-224431 | 8/1994 | ......... H01L/29/784 |
| JP | 06-302828 | 10/1994 | ......... H01L/29/788 |

OTHER PUBLICATIONS

*The Handbook of Binary Phase Diagrams*, 4, Genium Publishing, results summarized from the Constitution of Binary Alloys, pp. 916–919, 1985; First Supplement to Constitution of Binary Alloys, pp. 508–509, 1985; Second Supplement to Constitution of Binar Alloys, pp. 494–495, 1985,(1987), 10 pages.

(Continued)

*Primary Examiner*—Tom Thomas
*Assistant Examiner*—Eugene Lee
(74) *Attorney, Agent, or Firm*—Schwegman, Lundberg, Woessner & Kluth, P.A.

(57) ABSTRACT

A typical integrated-circuit fabrication requires interconnecting millions of microscopic transistors and resistors with metal wires. Making the metal wires flush, or coplanar, with underlying insulation requires digging trenches in the insulation, and then filling the trenches with metal to form the wires. The invention provides a new "trench-less" or "self-planarizing" method of making coplanar metal wires. Specifically, one embodiment forms a first layer that includes silicon and germanium; oxidizes a region of the first layer to define an oxidized region and a non-oxidized region; and reacts aluminum or an aluminum alloy with the non-oxidized region. The reaction substitutes, or replaces, the non-oxidized region with aluminum to form a metallic wire coplanar with the first layer. Another step removes germanium oxide from the oxidized region to form a porous insulation having a very low dielectric constant, thereby reducing capacitance.

20 Claims, 3 Drawing Sheets

U.S. PATENT DOCUMENTS

| | | | |
|---|---|---|---|
| 4,169,000 A | 9/1979 | Riseman | 148/187 |
| 4,234,357 A | 11/1980 | Scheppele | 148/1.5 |
| 4,252,582 A | 2/1981 | Anantha et al. | 148/175 |
| 4,442,449 A | 4/1984 | Lehrer et al. | 357/67 |
| 4,470,852 A | 9/1984 | Ellsworth | 148/1.5 |
| 4,483,726 A | 11/1984 | Isaac et al. | 148/187 |
| 4,507,673 A | 3/1985 | Aoyama et al. | 357/23 R |
| 4,507,847 A | 4/1985 | Sullivan | 29/576 |
| 4,651,409 A | 3/1987 | Ellsworth et al. | 29/576 B |
| 4,670,297 A | 6/1987 | Lee et al. | 427/91 |
| 4,702,941 A | 10/1987 | Mitchell et al. | 427/250 |
| 4,800,177 A | 1/1989 | Nakamae | 437/193 |
| 4,855,252 A | 8/1989 | Peterman | 437/189 |
| 4,857,481 A | 8/1989 | Tam et al. | 437/182 |
| 4,893,273 A | 1/1990 | Usami | 365/185 |
| 4,902,637 A * | 2/1990 | Kondou et al. | 438/152 |
| 4,959,705 A | 9/1990 | Lemnios | 257/522 |
| 4,987,562 A | 1/1991 | Watanabe | 357/67 |
| 5,010,039 A | 4/1991 | Ku et al. | 437/228 |
| 5,040,049 A | 8/1991 | Raaijmakers | 357/71 |
| 5,051,805 A | 9/1991 | Custode | 357/34 |
| 5,059,389 A | 10/1991 | Finkl et al. | 420/67 |
| 5,111,430 A | 5/1992 | Morie | 365/185 |
| 5,118,634 A | 6/1992 | Neudeck et al. | 437/31 |
| 5,128,744 A * | 7/1992 | Asano et al. | 257/508 |
| 5,148,260 A | 9/1992 | Inoue et al. | 357/67 |
| 5,158,986 A | 10/1992 | Cha et al. | 521/82 |
| 5,187,560 A | 2/1993 | Yoshida et al. | 257/743 |
| 5,191,405 A * | 3/1993 | Tomita et al. | 257/777 |
| 5,235,204 A | 8/1993 | Tsai | 257/408 |
| 5,241,193 A | 8/1993 | Pfiester et al. | 257/67 |
| 5,260,593 A | 11/1993 | Lee | 257/316 |
| 5,268,315 A | 12/1993 | Prasad et al. | 437/31 |
| 5,280,188 A | 1/1994 | Iwasaki | 257/370 |
| 5,293,560 A | 3/1994 | Harari | 365/185 |
| 5,308,440 A | 5/1994 | Chino et al. | 156/664 |
| 5,317,535 A | 5/1994 | Talreja et al. | 365/185 |
| 5,324,684 A | 6/1994 | Kermani et al. | 437/95 |
| 5,334,356 A | 8/1994 | Baldwin et al. | 422/133 |
| 5,341,016 A | 8/1994 | Prall et al. | 257/412 |
| 5,355,020 A | 10/1994 | Lee et al. | 257/741 |
| 5,369,040 A | 11/1994 | Halvis et al. | 437/3 |
| 5,371,035 A | 12/1994 | Pfiester et al. | 437/69 |
| 5,388,069 A | 2/1995 | Kokubo | 365/185 |
| 5,391,911 A | 2/1995 | Beyer et al. | 257/522 |
| 5,424,993 A | 6/1995 | Lee et al. | 365/218 |
| 5,436,496 A | 7/1995 | Jerome et al. | 257/529 |
| 5,438,544 A | 8/1995 | Makino | 365/185 |
| 5,442,226 A | 8/1995 | Maeda et al. | 257/557 |
| 5,449,941 A | 9/1995 | Yamazaki et al. | 257/411 |
| 5,454,928 A | 10/1995 | Rogers et al. | 205/125 |
| 5,458,702 A | 10/1995 | Ono et al. | 148/432 |
| 5,465,249 A | 11/1995 | Cooper et al. | 365/149 |
| 5,467,306 A | 11/1995 | Kaya et al. | 365/185.2 |
| 5,470,801 A | 11/1995 | Kapoor et al. | 437/238 |
| 5,477,485 A | 12/1995 | Bergemont et al. | 365/185.24 |
| 5,493,140 A | 2/1996 | Iguchi | 257/316 |
| 5,501,645 A | 3/1996 | Taniguchi et al. | 477/130 |
| 5,508,543 A | 4/1996 | Hartstein et al. | 257/314 |
| 5,510,645 A | 4/1996 | Fitch et al. | 257/522 |
| 5,512,785 A | 4/1996 | Haver et al. | 257/758 |
| 5,516,724 A | 5/1996 | Ast et al. | 437/160 |
| 5,516,745 A | 5/1996 | Friesen et al. | 502/401 |
| 5,530,581 A | 6/1996 | Cogan | 359/265 |
| 5,539,227 A | 7/1996 | Nakano | 257/276 |
| 5,541,124 A | 7/1996 | Miwa et al. | 437/31 |
| 5,554,867 A * | 9/1996 | Ajika et al. | 257/314 |
| 5,563,448 A | 10/1996 | Lee et al. | 257/742 |
| 5,580,380 A | 12/1996 | Liu et al. | 117/86 |
| 5,587,326 A | 12/1996 | Takemura | 437/31 |
| 5,593,921 A | 1/1997 | Chen et al. | 437/195 |
| 5,639,979 A | 6/1997 | Chen et al. | 84/615 |
| 5,643,806 A | 7/1997 | Miwa et al. | 437/31 |
| 5,648,280 A | 7/1997 | Kato | 437/31 |
| 5,670,790 A | 9/1997 | Katoh et al. | 257/14 |
| 5,686,760 A * | 11/1997 | Miyakawa | 257/751 |
| 5,698,890 A | 12/1997 | Sato | 257/592 |
| 5,705,425 A | 1/1998 | Miura et al. | 437/182 |
| 5,710,454 A | 1/1998 | Wu | 257/413 |
| 5,723,378 A | 3/1998 | Sato | 438/309 |
| 5,731,240 A | 3/1998 | Kataoka | 438/364 |
| 5,745,990 A | 5/1998 | Lee et al. | 29/852 |
| 5,753,967 A | 5/1998 | Lin | 257/635 |
| 5,757,072 A | 5/1998 | Gorowitz et al. | 257/700 |
| 5,766,999 A | 6/1998 | Sato | 438/309 |
| 5,796,151 A | 8/1998 | Hsu et al. | 257/410 |
| 5,796,166 A | 8/1998 | Agnello et al. | 257/751 |
| 5,798,544 A | 8/1998 | Ohya et al. | 257/296 |
| 5,798,559 A | 8/1998 | Bothra et al. | 257/522 |
| 5,801,444 A | 9/1998 | Aboelfotoh et al. | 257/762 |
| 5,847,439 A | 12/1998 | Reinberg | 257/522 |
| 5,861,340 A | 1/1999 | Bai et al. | 438/592 |
| 5,891,797 A | 4/1999 | Farrar | 438/619 |
| 5,920,121 A | 7/1999 | Forbes et al. | 257/742 |
| 5,925,918 A | 7/1999 | Wu et al. | 257/413 |
| 5,925,933 A | 7/1999 | Colgan et al. | 257/762 |
| 5,930,596 A | 7/1999 | Klose et al. | 438/98 |
| 5,930,668 A | 7/1999 | Gardner | 438/624 |
| 5,942,799 A | 8/1999 | Danek et al. | 257/751 |
| 5,960,313 A | 9/1999 | Jun | 438/624 |
| 5,989,718 A | 11/1999 | Smith et al. | 428/446 |
| 6,025,261 A | 2/2000 | Farrar et al. | 438/619 |
| 6,069,389 A | 5/2000 | Sasaki | 257/370 |
| 6,080,646 A | 6/2000 | Wang | 438/585 |
| 6,118,151 A * | 9/2000 | Tsutsu | 257/347 |
| 6,150,252 A | 11/2000 | Hsu et al. | 438/597 |
| 6,157,082 A | 12/2000 | Merchant et al. | 257/758 |
| 6,180,509 B1 | 1/2001 | Huang et al. | 438/624 |
| 6,211,562 B1 | 4/2001 | Forbes et al. | 257/581 |
| 6,245,663 B1 | 6/2001 | Zhao et al. | |
| 6,265,602 B1 | 7/2001 | Voit et al. | 558/459 |
| 6,271,551 B1 | 8/2001 | Schmitz et al. | 257/288 |
| 6,504,224 B1 * | 1/2003 | Ahn et al. | 257/508 |

OTHER PUBLICATIONS

"Merriam–Webster's Collegiate Dictionary", *10th Edition*, (1998),pp.610.

Akasaki, I., et al., "Effects of AIN Buffer Layer on Crystallographic Structure and on Electrical and Optical Properties of GaN and Ga(1–x)Al(x)N [0< x (< or x) 0.4] Films Grown on Sapphire Substrate by MOVPE", *J. Crystal Growth, 98,* (1989), 209–219.

Alok, D., et al., "Electrical Properties of Thermal Oxide Grown on N–type 6H–Silicon Carbide", *Applied Physics Letters, 64,* (May 23, 1994), 2845–2846.

Andrieux, M., et al., "Interface and Adhesion of PACVD SiC Based Films on Metals", *Supp. Le Vide: Science, Technique et applications, 279,* (1996), 212–214.

Anonymous, "Method to Reduce Mechanical Stress Within the Emitter of Bipolar Transistors", *IBM Technical Disclosure Bulletin, 28,* (Sep. 1, 1985),p. 1442.

Ashburn, P., et al., "Comparison of Experimental and Theoretical Results on Polysilicon Emitter Bipolar Transistors", *IEEE Trans. on Electron Devices, vol. ED–31,* (1984), 853–60.

Bachmann, P., et al., "Influence on Surface Modifications on the Electronic Properties of CVD Diamond Films", *Diamond and Related Materials, 5,* (1996), 1378–1383.

Baglee, D., "Characteristics & Reliability of 100 Angstrom Oxides", *IEEE 22nd Annual Proc.; Reliability Physics,* Las Vegas, (Apr. 3–5, 1984), 152–155.

Beheim, G., et al., "Magnetron Plasma Etching of SiC for Microstructures", *Proc: SPIE—Integrated Optics and Microstructures III,* San Jose, CA,(Jan. 29, 1996), 82–86.

Bengtsson, S., et al., "Applications of Aluminum Nitride Films Deposited by Reactive Sputtering to Silicon–On–Insulator Materials", *Japanese J. Applied Physics, 35,* (1996), 4175–4181.

Benjamin, M., et al., "UV Photoemission Study of Heteroepitaxial AlGaN Films Grown on 6H–SiC", *Applied Surface Science, 104/105,* (1996), 455–460.

Berezhnoi, A., *Silicon and its Binary Systems,* Consultants Bureau, New York,(1960), 84.

Bermudez, V., et al., "The Growth and Properties of Al and AlN Films on GaN(001)–(1 x 1)", *J. Applied Physics, 79,* (Jan. 1996),110–119.

Boeringer, Daniel W., et al., "Avalanche amplification of multiple resonant tunneling through parallel silicon microcrystallites", *Physical Rev. B, 51,* (1995), 13337–13343.

Campbell, S A., *The Science and Engineering of Microelectronic Fabrication,* Oxford University Press, (1996), 476.

Casey, H., et al., "Low Interface Trap Density for Remote Plasma Deposited SiO2 on n–type GaN", *Applied Phys. Lett., 68,* (Mar. 1996), 1850–1852.

Chang, C., et al., "Novel Passivation Dielectrics– The Boron– or Phosphorus–Doped Hydrogenated Amorphous Silicon Carbide Films", *Journal of the Electrochemical Society, 132,* (Feb. 1985),418–422.

Cherkasov, Y A., et al., "Optical information media based on an amorphous photoconductor with high avalanche amplification—the amorphous analog of trigonal selenium", *Journal of Optical Technology, vol. 64, No. 7,* (Jul. 7, 1997), 627–32.

Choi, J., et al., "Effect of Deposition Conditions and Pretreatments on the Microstructure of MPECVD Diamond Thin Films", *Materials Chemistry and Physics, 45,* (1996), 176–179.

Chor, E F., et al., "Emitter Resistance of Arsenic– and Phosphorous–Doped Polysilicon Emitter Transistors", *IEEE Trans. on Electron Devices, 6(10),* (Oct. 1985),pp. 516–518.

Clarke, G. , et al., "The Infrared Properties of Magnetron–Sputtered Diamond–Like Thin Films", *Thin Solid Films, 280,* (1996),130–135.

Compagnini, G. , et al., "Spectroscopic Characterization of Annealed Si(1–x)C(x) Films", *J. Materials Res., 11,* (Sep. 1996),2269–2273.

Dartnell, N. , et al., "Reactive Ion Etching of Silicon Carbide (Si(x)C(1–x))", *Vacuum, 46,* (1995),349–355.

Demichelis, F. , et al., "Influence of Doping on the Structural and Optoelectronic Properties of Amorphous and Microcrystalline Silicon Carbide", *Journal of Applied Physics, 72,* (Aug. 15, 1992),1327–1333.

Demichelis, F. , et al., "Physical Properties of Undoped and Doped Microcrystalline SiC:H Deposited By PECVD", *Materials Research Society Symposium Proceedings, 219,* Anaheim, CA,(4/10 –5/3, 1991),413–418.

Dipert, Brian, et al., "Flash Memory Goes Mainstream", *IEEE Spectrum, 30,* (Oct. 1993),pp. 48–52.

Edelberg, E. , et al., "Visible Luminescence from Nanocrystalline silicon films produced by plasma anhanced chemical vapor deposition", *Appl. Phys. Lett., 68,* (1996),1415–1417.

Fissel, A. , et al., "Epitaxial Growth of SiC Thin Films on Si–stabilized alpha–SiC (0001) at Low Temperatures by Solid–source Melecular Beam Epitaxy", *Journal of Crystal Growth, 154,* (1995),72–80.

Friedrichs, P. , et al., "Interface Properties of Metal–Oxide–Semiconductor Structures on N–Type 6H and 4H–SiC", *J. Applied Physics, 79,* (May 15, 1996),7814–7819.

Fujii, T. , et al., "Bonding Structures in Highly Photoconductive a–SiC:H Films Deposited by Hybrid–Plasma Chemical Vapor Deposition", *Journal of Non–Crystalline Solids, 198–200,* (1996),577–581.

Fukuda, Y. , et al., "A New Fusible–Type Programmable Element Composed of Aluminum and Polysilicon", *IEEE Trans. on Electron Devices, ED–33,* (Feb., 1986),250–253.

Goetzberger, A. , et al., *Applied Solid State Science: Advances in Materials and Device Research,* R. Wolfe, ed., Academic Press, New York,(1969),Including p. 233.

Graul, J. , et al., "Growth Mechanism of Polycrystalline beta–SiC Layers on Silicon Substrate", *Applied Phys. Lett., 21,* (Jul. 1972),67–69.

Hamakawa, Y. , et al., "Optoelectronics and Photovoltaic Applications of Microcrystalline SiC", *Materials Research Society Symposium Proceedings, 164,* Boston, MA,(11/29–12/1, 1989),291–301.

Hanna, J. , et al., "Early Stage of Polycrystalline Growth of Ge and SiGe by Reactive Thermal CVD from GeF(4) and Si(2)H(6)", *Materials Res. Soc. Symp. Proc., 358,* Boston, MA,(Nov./Dec., 1994),877–881.

Hansen, P., *Constitution of Binary Alloys,* McGraw–Hill, New York,(1958), 103.

He, Z. , et al., "Ion–beam–assisted Deposition of Si–carbide Films", *Thin Solid Films, 260,* (1995),32–37.

Hiraki, A. , et al., "Formation of Silicon Oxide over Gold Layers on Silicon Substrates", *J. Applied Physics, 43,* (Sep., 1972),3643–3649.

Hiraki, A. , et al., "Low–Temperature Migration of Silicon in Metal Films on Silicon Substrates Studiedby Backscattering Techniques", *J. Vacuum Science and Tech., 9,* (Jan./Feb., 1972),155–158.

Horie, H. , et al., "Novel High Aspect Ratio Aluminum Plug for Logic/DRAM LSI's Using Polysilicon–Aluminum Substitute", *Technical Digest: IEEE International Electron Devices Meeting,* San Francisco, CA,(1996),946–948.

Hu, G. , et al., "Will Flash Memory Replace Hard Disk Drive?", *1994 IEEE International Electron Device Meeting,* Panel Discussion, Session 24, Outline,(Dec. 1994),2 pages.

Hurley, P. , et al., "Low Temperature Plasma Oxidation of Polycrystalline Silicon", *Proc. 7th European Conf. on Insulating Films on Semiconductors: Contributed Papers, Section 5,* IOP Publishing Ltd.,(1991),235–238.

Hwang, J. , et al., "High Mobility beta–SiC Epilayer Prepared by Low–pressure Rapid Thermal Chemical Vapor Deposition on a (100) Silicon Substrate", *Thin Solid Films, 272,* (1996),4–6.

Hwang, J. , et al., "Novel Polysilicon/TiN Stacked–Gate Structure for Fully–Depleted SOI/CMOS", *Technical Digest: Int. Electron Devices Meeting,* San Francisco, CA,(Dec. 1992),345–348.

Hybertsen, Mark S., "Absorption and Emission of Light in Nanoscale Silicon Structures", *Phys. Rev. Lett., 72,* (1994), 1514–1517.

Jou, S. , et al., "Electron Emission Characterization of Diamond Thin Films Grown from a Solid Carbon Source", *Thin Solid Films, 280,* (1996),256–261.

Kato, Masataka, et al., "Read–Disturb Degradation Mechanism due to Electron Trapping in the Tunnel Oxide for Low–voltage Flash Memories", *IEEE Electron Device Meeting,* (1994),45–48.

King, T., et al., "Deposition and Properties of Low–Pressure Chemical–Vapor Deposited Polycrystalline Silicon–Germanium Films", *J. Electrochemical Society, 141,* (Aug. 1994), 2235–2241.

Kothandaraman, M., et al., "Reactive Ion Etching of Trenches in 6H–SiC", *J. Electronic Materials, 25,* (1996), 875–878.

Kumbhar, A., et al., "Growth of Clean Amorphous Silicon–Carbon Alloy Films by Hot–Filament Assisted Chemical Vapor Deposition Technique", *Applied Phys. Lett, 66,* (Apr. 1995),1741–1743.

Lakshmi, E., et al., "Interface–State Characteristics of GaN//GaAs MIS Capacitors", *Solid–State Electronics, 25,* (1982),811–815.

Lanois, F., et al., "Angle Etch Control for Silicon Carbide Power Devices", *Applied Phys. Lett., 69,* (Jul. 1996),236–238.

Lau, S., et al., "Optoelectronic Properties of Highly Conductive Microcrystalline SiC Produced by Laser Crystallization of Amorphous SiC", *J. of Non–Crystalline Solids, 198–200,* (1996),907–910.

Lee, D. H., et al., "Gate Oxide Integrity (GOI) of MOS transistors with W/TiN stacked gate", *1996 Symposium on VLSI Technology Digest of Technical Papers,* (1996),208–209.

Leggieri, G., et al., "Laser Ablation Deposition of Silicon Carbide Films", *Applied Surface Science, 96–98,* (1996), 866–869.

Lei, T., et al., "Epitaxial Growth and Characterization of Zinc–Blende Gallium Nitride on (001) Silicon", *J. Appl. Phys., 71,* (May 1992),4933–4943.

Li, P., et al., "Formation of Stoichiometric SlGe Oxide by Electron Cyclotron Resonance Plasma", *Appl. Phys. Lett, 60,* (Jun. 1992),3265–3267.

Li, C., et al., "Low Temperature Heteroepitaxial Growth of Si(1–x)Ge(x)–on–Si by Photo–Enhanced Ultra High Vacuum Chemical Vapor Deposition Using Si(2)H(6) and Ge(2)H(6)", *J. Electronic Materials, 24,* (Jul. 1995),875–884.

Liu, J., et al., "Formation of SiC Films on Silicon Field Emitters", *Materials Res. Soc. Symp. Proc., 311,* San Francisco, CA,(Apr. 13–15, 1993).

Liu, J., et al., "Modification of Si Field Emitter Surfaces by Chemical Conversion to SiC",*J. Vac. Sci. Technology, B 12,* (1994),717–721.

Luo, J., et al., "Localized Epitaxial Growth of Hexagonal and Cubic SiC Films on Si by Vacuum Annealing", *Applied Phys. Lett., 69,* (Aug. 1996),916–918.

Lyman, T. E., "Metallography, Structure and Phase Diagrams", *Metals Handbook, 8,* American Society for Metals; Metals Park, Ohio,(1989),253, 256, 260, 263.

Martins, R, et al., "Transport Properties of Doped Silicon Oxycarbide Microcrystalline Films Produced by Spatial Separation Techniques", *Solar Energy Materials and Solar Cells, 41–42,* (1996),493–517.

Martins, R., et al., "Wide Band Gap Microcrystalline Silicon Thin Films", *Diffusion and Defect Data : Solid State Phenomena, 44–46, Part 1,* Scitec Publications,(1995), 299–346.

Maury, F., et al., "Chemical Vapor Co–Deposition of C and SiC at Moderate Temperature for the Synthesis of Compositionally Modulated Si(x)C(1–x) Ceramic Layers", *Surface and Coatings Technology, 76–77,* (1995),119–125.

McLane, G., et al., "High Etch Rates of SiC in Magnetron Enhanced SF(6) Plasmas", *Applied Phys. Lett., 68,* (Jun. 1996),3755–3757.

Moffatt, W. G., *The Handbook of Binary Phase Diagrams,* General Electric Company,(1978),pp. 11/84, 3/84.

Moffatt, W. G., *The Handbook of Binary Phase Diagrams, 2.* Genium Publishing Corporation,(1984),p. 6/80.

Mogab, C., et al., "Conversion of Si to Epitaxial SiC by Reaction with C(2)H(2)", *J. Applied Physics, 45,* (Mar. 1974),1075–1084.

Mohajerzadeh, S., et al., "A Low Energy Ion Beam Assisted Deposition Technique for Realizing iso–type SiGe/Si hetero–interface diodes", *Thin Solid Films, 283,* (1996),182–187.

Mohajerzadeh, S., et al., "A Low–Temperature Ion Vapor Deposition Technique for Silicon and Silicon–Germanium Epitaxy", *Canadian J. Physics, 74,* (1996),S69–S73.

Mohri, M., et al., "Effect of SiF(4)/SiH(4)/H(2) Flow Rates on Film Properties of Low–Temperature Polycrystalline Silicon Films Prepared by Plasma Enhanced Chemical Vapor Deposition", *IEICE Transactions on Electronics, E77–C,* (Oct. 1994),1677–1684.

Moller, H, et al., "In–situ p– and n–Doping of Low Temperature Grown Beta–SiC Epitaxial Layers on Silicon", *Proc. of International Conference on Silicon Carbide and Related Materials,* IOP Publishing, UK,(1996),497–500.

Molnar, R., et al., "Growth of Gallium Nitride by Electron–Cyclotron Resonance Plasma–Assisted Molecular–Beam Epitaxy: The Role of Charged Species", *J. Appl. Phys., 76,* (1994),4587–4595.

Mukhopadhyay, M., et al., "Properties of SiGe Oxides Grown in a Microwave Oxygen Plasma",*J. Applied Physics, 78,* (Nov. 1995),6135–6140.

Muller, K., et al., "Trench Storage Node Technology for Gigabit DRAM Generations", *Digest IEEE International Electron Devices Meeting,* San Francisco, CA,(Dec. 1996), 507–510.

Nemanich, P, et al., "Diamond Negative Electron Affinity Surfaces, Structures and Devices", *Proc.: Third International Conference on Applications of Diamond Films and Related Materials, 1,* Gaithersburg, MD,(1995),17–24.

Nemanich, R., et al., "Negative Electron Affinity Surfaces of Aluminum Nitride and Diamond", *Diamond and Related Materials, 5,* (1996),790–796.

Ouyang, M., et al., "Deposition of Diamond–Like Carbon Films via Excimer Laser Ablation of Polybutadiene", *Materials Science and Engineering, B39,* (1996),228–231.

Pankove, J., "Photoelectric Emission", *In: Optical Processes in Semiconductors,* Dover Publications Inc., New York,(1971),287–301.

Pankove, J., et al., "Photoemission from GaN", *Applied Phys. Lett., 25,* (1974),53–55.

Papadas, C., et al., "Modeling of the Intrinsic Retention Characteristics of FLOTOX EEPROM Cells Under Elevated Temperature Conditions", *IEEE Transaction on Electron Devices, 42,* (Apr. 1995),678–682.

Patuwathavithane, C., et al., "Oxidation Studies for 6H–SiC", *Proc: 4th Int. Conf. on Amorphous and Crystalline Silicon Carbide IV,* Santa Clara, CA,(Oct. 9–11, 1991), 163–169.

Pereyra, I., et al., "Wide Gap a–Si(1–x)C(x): H Thin Films Obtained Under Starving Plasma Deposition Conditions", *J. Non–Crystalline Solids, 201,* (1996),110–118.

Pollack, S., "Electron Transport Through Insulating Thin Films", *Appl. Solid–State Science, 1,* (1969),345–355.

Predel, B., et al., "Die Zustandsdiagramme Silber–Germanium–Silizium und Gold–Germanium–Silizium", *J. Less–Common Metals, 44,* (Jan. 1976),39–49.

Prendergast, Jim, "FLASH or DRAM: Memory Choice for the Future", *IEEE Electron Device Meeting, Session 25,* Phoenix, AZ,(1995).

Rahman, M., et al., "Preparation and Electrical Properties of An Amorphous SiC/ Crystalline Si p(+)n Heterostructure", *Japanese J. Applied Physics, 23,* (May 1984),515–524.

Renlund, G, et al., "Silicon Oxycarbide Glasses: Part I. Preparation and Chemistry", *Journal of Materials Research, 6,* (Dec. 1991),2716–2722.

Renlund, G., et al., "Silicon Oxycarbide Glasses: Part II. Structure and Properties", *Journal of Materials Research, 6,* (Dec. 1991),2723–2734.

Schadel, H., et al., "Activity of Liquid Silver–Silicon Alloys", *Trans. American Institute of Mining and Metallurgical Engineers, 188,* (Oct. 1950),1282–1283.

Schmidt, I., et al., "Low Temperature Diamond Growth Using Fluorinated Hydrocarbons", *Diamond and Related Materials, 5,* (1996),1318–1322.

Schoenfeld, O., et al., "Formation of Si Quantum dots in Nanocrystalline silicon", *Proc. 7th Int. Conf. on Modulated Semiconductor Structures, Madrid,* (1995),605–608.

Serre, C., et al., "Ion–Beam Synthesis of Amorphous SiC Films: Structural Analysis and Recrystallization", *J. Appl. Phys., 79,* (May 1996),6907–6913.

Shafi, Z A., et al., "Poly–Crystalline Silicon–Carbide (SiC) Emitter Bipolar Transistors", *IEEE Bipolar Circuits and Technology Meeting,* Minneapolis, MN,(1991),67–70.

Shuto, Susumu, et al., "Read Disturb Degradation Mechanism for Source Erase Flash Memories", *1996 Symposium on VLSI Technology, Digest of Technical Papers,* Honolulu, HI,(1996),242–43.

Sim, S., et al., "A New Planar Stacked Technology (PST) for Scaled and Embedded DRAMs", *Digest IEEE Int. Electron Devices Meeting,* San Francisco, CA,(Dec. 1996),504–507.

Suzaki, Y, et al., "Quantum Size Effects of a–Si(:H)/ a–SiC(:H) Multilayer Films Prepared by rf Sputtering", *Abstracts of Papers Published in the Int. J. Japenese Soc. for Precision Engineering, 28,* Abstract of Paper in vol. 60,(Jun. 1994),182.

Svirkova, N., et al., "Deposition Conditions and Density–of–States Spectrum of a–Si(1–x)C(x) :H Films Obtained by Sputtering", *Semiconductors, 28* (Dec. 1994),1164–1169.

Sze, S., *Physics of Semiconductors,* 2nd Edition., John Wiley & Sons, Pub., New York, ISBN 0471056618,(1981).

Tarui, Y., "Flash Memory Features Simple Structure, Superior Integration", *JEE, 30,* (Sep. 1993),84–87.

Tenhover, M., et al., "DC–Magnetron Sputtered Silicon Carbide", *Materials Res. Soc. Symp. Proc., 356,* Boston, MA,(11/28–12/02, 1994),227–232.

Thomas, J., et al., "Plasma Etching and Surface Analysis of a–SiC :H Films Deposited by Low Temperature Plasma Enhanced Chemical Vapor Deposition", *Materials Res. Soc. Symp. Proc., 334,* Boston, MA,(11/29–12/02, 1993),445–450.

Tiwari, S., et al., "A silicon nanocrystal based memory", *Appl. Physics Lett., 68,* (1996), 1377–1379.

Tiwari, Sandip, et al., "Volatile and Non–Volatile Memories in Silicon with Nano–Crystal Storage", *Int'l Electron Devices Meeting: Technical Digest,* Washington, DC,(Dec. 1995),521–524.

Tsu, Raphael, et al., "Slow Conductance oscillations in nanoscale silicon clusters of quantum dots", *Appl. Phys. Lett., 65,* (1994),842–844.

Tsu, R., et al., "Tunneling in Nanoscale Silicon Particles Embedded in an a–SiO2 Matrix", *Abstract, IEEE Device Research Conference,* (1996),pp. 178–179.

Tucker, C., et al., "Ion–beam–assisted Deposition of Non-hydrogenated a–Si:C Films", *Can. J. Physics, 74,* (1996), 97–101.

Uchino, T, et al., "Very High Speed Silicon Bipolar Transistors with In–Situ Doped Polysilicon Emitter and Rapid Vapor–Phase Doping Base", *IEEE Trans. on Electron Devices, vol. 42, No. 1,* (1995),406–12.

Ushiku, Y., et al., "Planarized Silver Interconnect Technology with a Ti Self–Passivation Technique for Deep Sub–Micron ULSIs", *1993 Symp. on VLSI Technology: Digest of Technical Papers,* (1993),121–122.

Van Der Weide, J, et al., "Negative–electron–affinity Effects on the Diamond (100) Surface", *Physical Review B [Condensed Matter], 50,* (Aug. 15, 1994),5803–5806.

Van Zant, Peter, "via–definition", *Microchip Fabrication. A Practical Guide to Semiconductor Processing,* 3rd Edition, McGraw–Hill, New York, NY,(1997),604.

Villars, P, et al., *Handbook of Ternary Alloy Phase Diagrams, vol. 3,* ASM International,2893–99.

Vodakov, Y., et al., "Diffusion and Solubility of Impurities in Silicon Carbide", *In: Silicon Carbide,* R.C. Marshall, et al., eds., Univ. of South Carolina Press,(1973),508–519.

Wahab, Q., et al., "3C–SiC / Si / 3C–SiC Epitaxial Trilayer Films Deposited on Si (111) Substrates by Reactive Magnetron Sputtering", *J. Materials Res., 10,* (Jun. 1995),1349–1351.

Walczyk, F., et al., "Tailoring Interfacial Oxide for Polysilicon Bit–Cell Contacts and Emitters with In Situ Vapor HF Interface Cleaning and Polysilicon Deposition in a 4Mbit BiCMOS Fast Static RAM", *IEEE Bipolar Circuits and Technology Meeting,* (1992),84–87.

Watanabe, A., et al., "SiC Thin Film Preparation by ArF Excimer Laser Chemical Vapor Deposition. Part 1: Rate of Photolysis of Alkylsilanes by ArF Excimer Laser and their Decomposition Products", *Thin Solid Films, 274,* (1996), 70–75.

Wolf, S., *In: Silicon Processing for the VLSI Era, vol. 2: Process Integration,* Lattice Press, Sunset Beach, CA,(1990),p. 116–117, 126–127.

Wolter, S., et al., "Textured Growth of Diamond on Silicon via in situ Carburization and Bias–Enhanced Nucleation", *Appl. Phys. Lett., 62,* (Mar. 1993),1215–1217.

Wu, S., et al., "Suppression of the Boron Penetration Induced Si/SiO2 Interface Degradation by Using a Stacked–Amorphous–Silicon Film as the Gate Structure for pMOSFET", *IEEE Electron Device Letters, 15,* (May 1994), 160–162.

Wu, K., et al., "The Growth and Characterization of Silicon/Silicon Carbide Heteroepitaxial Films on Silicon Substrates by Rapid Thermal Chemical Vapor Deposition", *Japanese J. Appl. Phys., 35,* (1996),3836–3840.

Yamaguchi, Y., et al., "Properties of Heteroepitaxial 3C–SiC Films Grown by LPCVD", *Digest of Tech. Papers: 8th Int. Conf. on Solid–State Sensors and Actuators and Eurosensors IX, vol. 2,* Stockholm, Sweden,(Jun. 1995), 190–193.

Yamanashi, H., et al., "Deposition of Silicon Compound Thin Films in DC Discharge Plasma Using Hydrogen–Hexamethyldisilane Gas Mixture", *Proc.: Int. Symp. on Surfaces and Thin Films of Electronic Materials. Bull. of the Res. Institute of Electronics, Shizuoka University, 30,* (1995), 95–98.

Ye, Qiu–Yi, et al., "Resonant Tunneling via Microcrystalline–silicon quantum confinement", *Physical Rev. B, 44,* (1991),1806–1811.

Yee, A., et al., "The Effect of Nitrogen on Pulsed Laser Deposition of Amorphous Silicon Carbide Films: Properties and Structure", *J. Materials Research, 11,* (1996),1979–1986.

Yoder, M, "Wide Bandgap Semiconductor Materials and Devices", *IEEE Transactions on Electron Devices, 43,* (Oct. 1996),1633–1636.

Zhao, X., et al., "Nanocrystalline Si: a material constructed by Si quantum dots", *1st Int. Conf. on Low Dimensional Structures and Devices, Singapore,* (1995),467–471.

\* cited by examiner

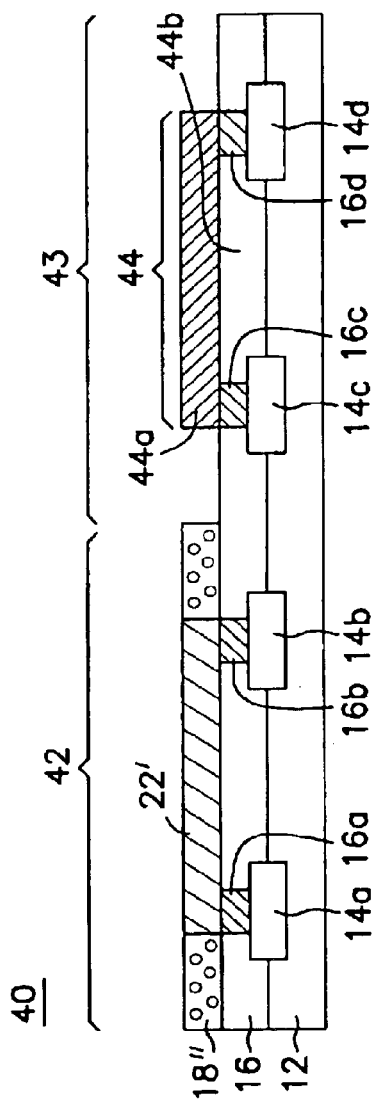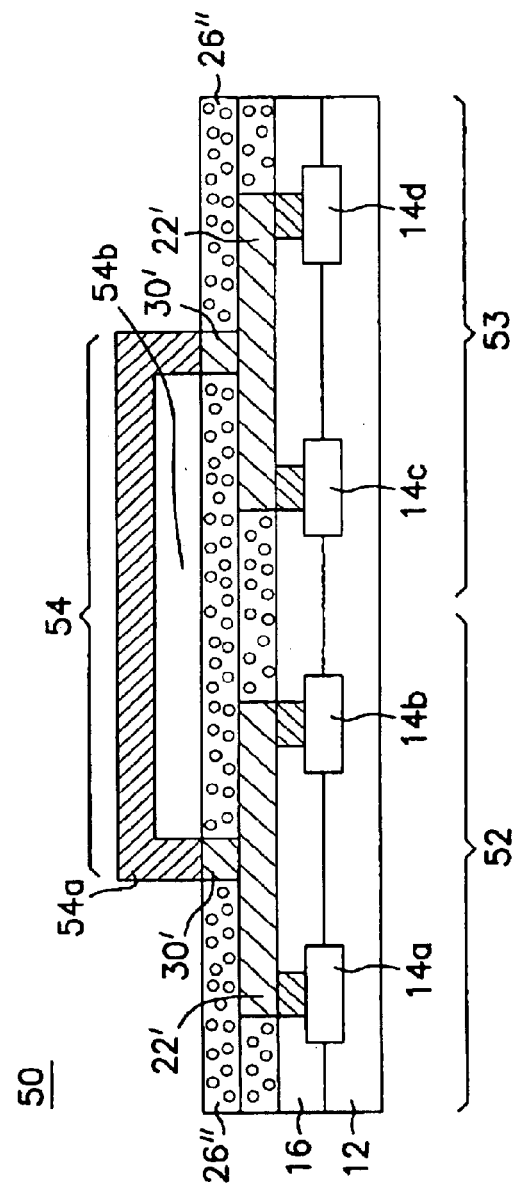

METHODS AND STRUCTURES FOR METAL INTERCONNECTIONS IN INTEGRATED CIRCUITS

This application is a Continuation of U.S. application Ser. No. 09/651,471, filed Aug. 30, 2000 U.S. Pat. No. 6,504,224, which is a Divisional of U.S. application Ser. No. 09/030,430, filed Feb. 25, 1998, now U.S. Pat. No. 6,121,126, all of which are incorporated herein by reference.

BACKGROUND OF THE INVENTION

The present invention concerns methods of making, or fabricating, integrated circuits, particularly methods of forming interconnects.

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then "wired," or interconnected, together to define a specific electric circuit, such as a computer memory.

Interconnecting millions of microscopic components typically entails covering the components with an insulative layer, etching small holes in the insulative layer to expose portions of the components underneath, and then actually connecting the components through metallization. Metallization is the process of depositing a metal, usually an aluminum alloy, into the small holes and onto the insulative layer to form line-like, metallic paths, or wires, between the components. Photolithography, an optical-patterning technique, defines the particular wiring or interconnection pattern.

Frequently, several levels of metallization, sometimes as many as six or seven, are necessary to make a particular circuit. Such cases require covering each metallization level with insulation, etching holes to expose portions of an underlying metallization, and then depositing more metal to form additional wires, connecting the exposed portions of the underlying metallization.

Current interconnection techniques suffer from two significant shortcomings. First, because of limitations in the photolithography used to define metallization patterns, current techniques require digging trenches to ensure that deposited metallic lines are flush, or coplanar, with the surface of the underlying insulation. However, digging these trenches is a time-consuming step which ultimately increases the cost of manufacturing integrated circuits.

Secondly, current techniques yield interconnective structures of insulation and metal that are highly capacitive. High capacitance wastes power and slows the response of integrated circuits to electrical signals. Thus, current interconnection techniques stand in the way of faster and more-efficient integrated circuits.

Accordingly, there is not only a need for new interconnection methods that eliminate the trench-digging step, but also a need for new methods and interconnective structures that yield faster and more-efficient integrated circuits.

SUMMARY OF THE INVENTION

To address these and other needs, the present invention provides a new method of making coplanar metallic and insulative members for an integrated circuit. Specifically, one embodiment of the method entails forming a first layer that includes silicon and germanium, and then oxidizing a region of the first layer to define an oxidized region and a non-oxidized region. After oxidation, the method reacts aluminum or an aluminum alloy with the non-oxidized region. The reaction substitutes, or replaces, the non-oxidized region with aluminum alloy to form a metallic member flush or coplanar with the first layer. Another step removes germanium oxide from the oxidized region to form a porous insulative member having a low dielectric constant.

Thus, the method of the present invention yields a self-planarizing metallic structure that not only eliminates the time-consuming, trench-digging step of conventional methods, but also places the metallic structure within a low-dielectric insulation that allows faster, more-efficient integrated circuits.

BRIEF DESCRIPTION OF THE DRAWINGS

The following figures are used to describe many aspects of the invention:

FIG. 9 is a cross-sectional view of an integrated-circuit assembly embodying a coplanar hybrid interconnect system; and FIG. 10 is a cross-sectional view of an integrated-circuit assembly embodying a two-level (non-coplanar) hybrid interconnect system.

DESCRIPTION OF THE PREFERRED EMBODIMENTS

The following detailed description, which references and incorporates FIGS. 1–10, describes and illustrates specific embodiments of the invention. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

The detailed description includes two sets of separate but overlapping embodiments of the invention. The first set of embodiments, illustrated principally with FIGS. 1–8, pertains to a preferred method of making single- and multi-level interconnective structures. The second set of embodiments, illustrated principally with FIGS. 9 and 10, concern hybrid interconnect structures which combine air bridges with structures exemplified in the first set of embodiments.

Preferred Method of Making Single- and Multi-Level Interconnects

Figure 1:
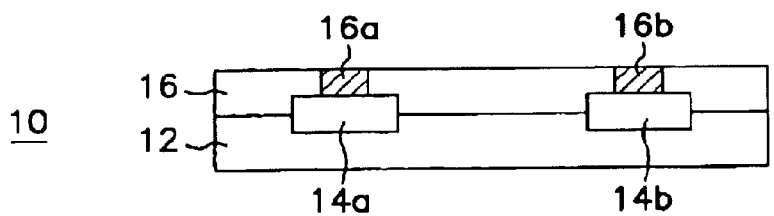
FIG. 1 is a cross-sectional view of an integrated-circuit assembly.

FIGS. 1–8 show a number of preferred integrated-circuit assemblies, which taken collectively and sequentially, illustrate the preferred method of the present invention. The method, as shown in FIG. 1, begins with a known integrated-circuit assembly or structure 10. Assembly 10 includes a substrate 12 which supports a number of integrated elements 14, preferably transistors 14a and 14b. (The term "substrate" encompasses semiconductor wafers as well as structures having one or more insulative, conductive, or semiconductive layers and materials, for example, silicon-on-insulator or silicon-on-sapphire structures.) Transistors 14a and 14b are covered by an insulative layer 16, which preferably comprises silicon oxide, nitride, or oxynitride. Layer 16 includes two aluminum vias 16a and 16b electrically connected to respective transistors 14a and 14b.

Figure 2:
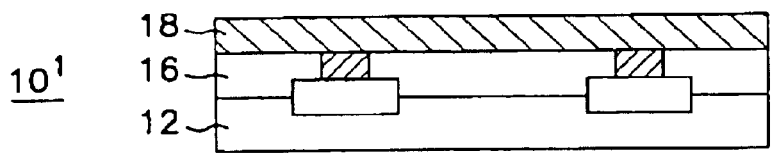
FIG. 2 is a cross-sectional view of the FIG. 1 integrated-circuit assembly after formation of silicon-germanium layer.

Next, as FIG. 2 shows, the preferred method forms a polycrystalline, silicon-germanium (SiGe) layer 18 on insulative layer 16 and over vias 16a and 16b. In the preferred embodiment, silicon-germanium layer 18 is approximately one micron thick, and comprises between 10 and 40 percent germanium. The layer is formed through conventional low-pressure chemical-vapor deposition (LP-CVD), specifically the pyrolysis of silicon hydride ($SiH_4$) and germanium hydride ($GeH_4$) gases at a temperature as low as 400° C. For more details on this technique, which controls the silicon-germanium composition by varying the gas flow rates, refer to the T. J. King article, entitled "Deposition and Properties of Low-Pressure Chemical-Vapor Deposited Polycrystalline Silicon-Germanium Films," in the Journal of the Electro-Chemical Society (pp. 2235–41, August 1994). This article is incorporated by reference.

Deposition temperatures lower than 400° C. are possible through plasma-enhanced chemical-vapor deposition. The silicon-germanium film can also be grown using other gases, such as germanium fluoride ($GeF_4$). See, for example, the J. I. Hanna article entitled "Early Stage of Polycrystalline Growth of Ge and SiGe by Reactive Thermal CVD from $GeF_4$ and $Si_2H_6$ (Microcrystalline and Nanocrystalline Semiconductors Symposium, Boston 1994, pp. 877–881, 1995), which is incorporated herein by reference.

Figure 3A:
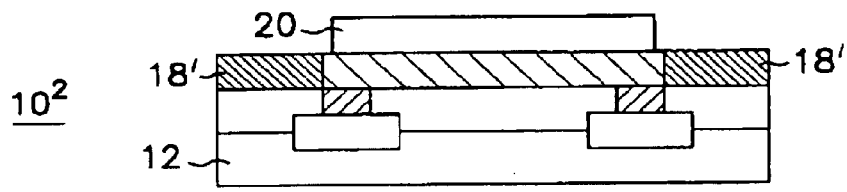
FIG. 3A is a cross-sectional view of the FIG. 2 integrated-circuit assembly after formation of an oxidation mask.
Figure 3B:
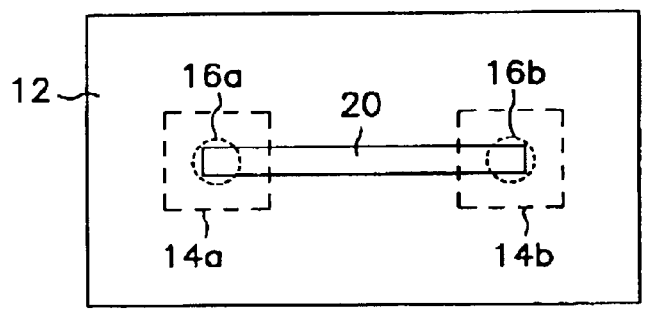
FIG. 3B is a top view of the FIG. 3A integrated-circuit assembly, showing the oxidation mask.

In FIG. 3A, the method forms an oxidation mask 20 on silicon-germanium layer 18. This mask defines a narrow, rectangular channel which ultimately defines the periphery of a conductor connecting vias 16a and 16b and thus transistors 14a and 14b. A top view of mask 20 and its relation to transistors 14a and 14b and vias 16a and 16b is shown in FIG. 3B.

To form mask 20, the method deposits a layer of silicon nitride ($Si_3N_4$), using low-pressure or plasma-enhanced chemical-vapor deposition. Conventional lithographic techniques define the mask, finally formed through reactive-ion or plasma etching of the silicon-nitride layer. The actual mask thickness, which preferably ranges between 30 and 100 nanometers, depends on the etchant used to remove the unwanted silicon nitride.

After completion of mask 20, the method oxidizes silicon-germanium layer 18. This oxidization defines regions under mask 20 as non-oxidized regions and unmasked regions as oxidized regions. The oxidized regions contain an extractable or removable germanium oxide, which can be removed to leave a porous insulator having a low dielectric constant. The non-oxidized regions eventually become the metallic or conductive member connecting transistors 14a and 14b. In the preferred embodiment, the oxidation is plasma enhanced to occur at temperatures below 200° C. The results of oxidation are shown as regions 18' in FIG. 3A.

Figure 4:
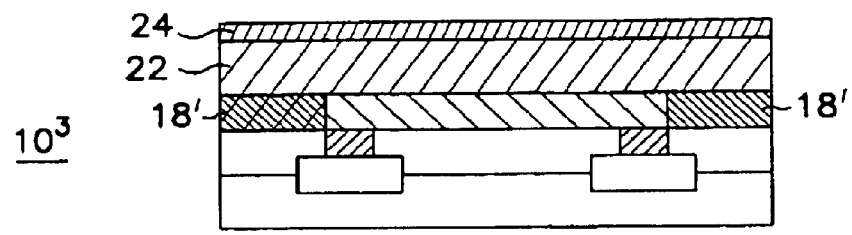
FIG. 4 is a cross-sectional view of the FIG. 3 integrated-circuit assembly after removal of the oxidation mask and formation of an aluminum alloy layer and a titanium layer.
Figure 5:
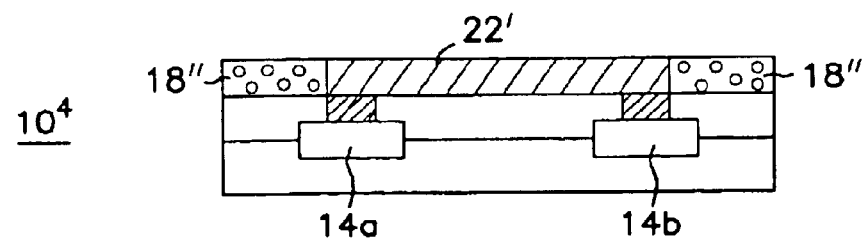
FIG. 5 is a cross-sectional view of the FIG. 4 assembly after reaction of the aluminum alloy layer and the silicon-germanium layer.

In FIG. 4, the method entails removing mask 20, preferably through chemical etching or chemical-mechanical polishing, to leave silicon-germanium layer 18, including oxidized regions 18', with a planar surface. Afterward, physical or chemical vapor deposition forms a 1.5-micron-thick, metal layer 22 on the oxidized and non-oxidized regions of layer 18. In the preferred embodiment the metal is an aluminum alloy that includes 0.3 to 4.0 percent copper (Al—Cu), but in another embodiment, the aluminum alloy also includes 0.3 to 1.6 percent silicon. The copper and silicon additions reduce electro-migration of the aluminum at high current levels.

Next, the method forms a 200-nanometer-thick, titanium layer 24 on layer 22 by physical vapor deposition. In other embodiments, layer 24 is between 500 and 2500 Angstroms thick and comprises zirconium or hafnium, instead of titanium. Layer 24, which is optional, reduces the temperature and time necessary to complete the next step.

The next step forces a metal-substitution reaction between metal layer 22 and the non-oxidized, or desired metallic, regions of silicon-germanium layer 18. To force this reaction, the method heats or anneals the integrated-circuit assembly to 400° C. in a nitrogen, forming gas, or other non-oxidizing atmosphere for approximately 60 minutes. The substitution temperature, that is, the annealing temperature, should be lower than the eutectic (lowest melting) temperature of the ternary aluminum-silicon-germanium system for the reaction or substitution to occur. Heating urges or causes diffusion or dissolution of the non-oxidized regions of metal layer 20 into silicon-germanium layer 18 and silicon-germanium into the metal layer, ultimately substituting the non-oxidized regions of silicon-germanium layer 18 with metal from metal layer 22, an aluminum-copper alloy in the preferred embodiment. Consequently, a coplanar metallic structure 22', consisting essentially of metal from layer 22 with small amounts of silicon and germanium, forms in silicon-germanium layer 18. Thus, unlike conventional techniques that require trench-digging (or other pre-metallization steps) to promote co-planarity of deposited metallic structures and underlying insulative structures, the present method is "self-planarizing" or "self-trenching."

After the reaction, a small amount of germanium may remain on metallic structure 22'. Additionally, any metal from metal layer 22 that remains on the surface of layer 18, such as an aluminum alloy of the preferred embodiment, may contain titanium silicide and silicon-germanium agglomerates. These are removed by chemical-mechanical polishing or other suitable techniques.

Finally, to reduce the dielectric constant of oxidized regions 18', germanium oxide in the oxidized regions of silicon-germanium layer 18 is removed using a wet etchant, such as distilled or deionized water. This leaves a porous oxide, insulative structure with a low dielectric constant which ultimately reduces capacitance and allows a faster, more efficient integrated circuit. The porous oxide regions are designated 18".

Figure 6A:
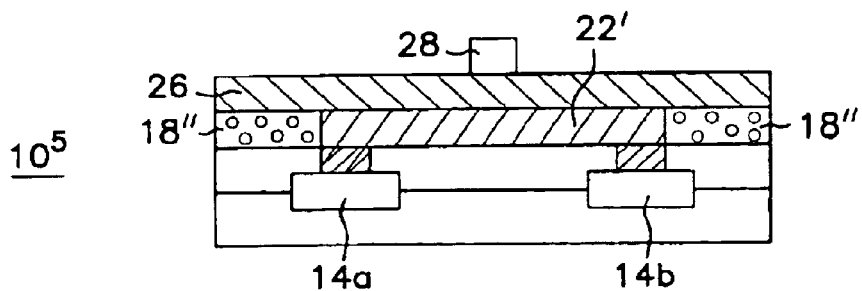
FIG. 6A is a cross-sectional view of the FIG. 5 integrated-circuit assembly after formation of a silicon-germanium layer and an oxidation mask.
Figure 6B:
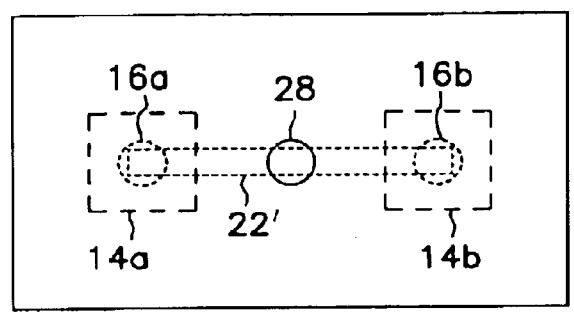
FIG. 6B is a top view of the FIG. 6A integrated-circuit assembly, showing the oxidation mask.

Further fabrication of more interconnection or metallization levels would entail repeating the steps already described and illustrated. For example, to form a second level that includes a via, the preferred embodiment, as illustrated in FIG. 6A, forms a second silicon-germanium layer 26 and then an oxidation mask 28 defining the size, shape, and position of the via relative conductor 22'. FIG. 6B shows a top view of the mask and its position relative conductor 22'.

Figure 7:
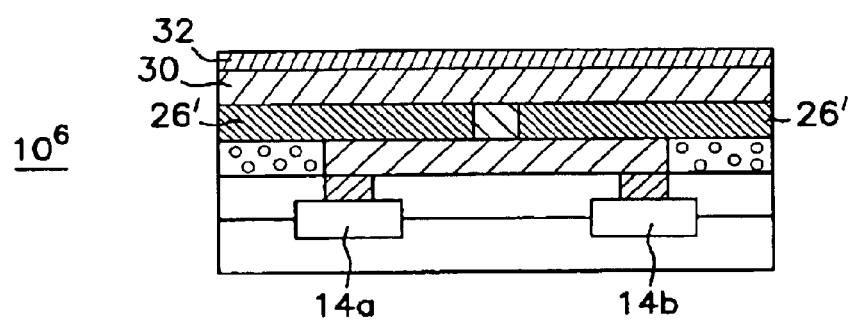
FIG. 7 is a cross-sectional view of the FIG. 6 integrated-circuit assembly after oxidation, removal of the oxidation mask, and formation of an aluminum alloy layer and a titanium layer.

After oxidizing the unmasked portions of silicon-germanium layer 26 and then removing oxidation mask 28, the method forms a second metal (aluminum-alloy) layer 30 and a second titanium layer 32 as shown in FIG. 7. The integrated-circuit assembly is then heated to force the metal-substitution reaction, thereby substituting a portion of metal layer 30 for the non-oxidized portion of layer 26, forming a substantially coplanar via 30' (shown in FIG. 8). Notably, this technique, unlike conventional techniques that require forming an insulative layer, etching holes to define the vias, and then finally filling these holes with metal to form the vias, proceeds without etching and filling holes. Thus, the present invention provides an "etchless" or "hole-less" method of forming vias.

Figure 8:
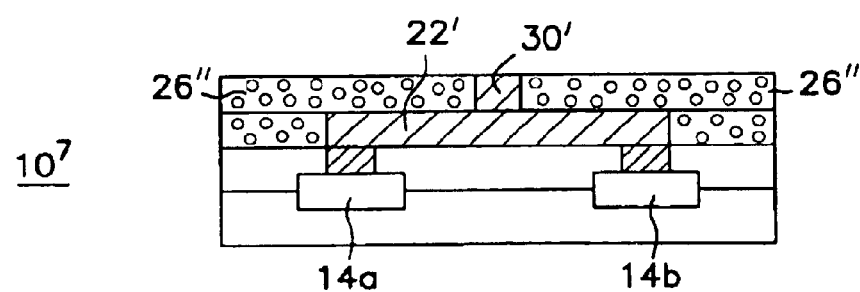
FIG. 8 is a cross-sectional view of the FIG. 7 assembly after reaction of the aluminum alloy layer and the silicon-germanium layer.

After, fonning via 30', wet etching removes germanium oxide from regions 26' to form porous low-dielectric insulation 26" around via 30'. The resulting integrated-circuit assembly is depicted in FIG. 8. Subsequent metallizations would follow similarly.

With completion of the desired number of metallization levels, the preferred method ultimately concludes by heat-treating the integrated circuit for one to six hours at a temperature between 100 and 200° C. This heat treatment, which preferably occurs after packaging the integrated circuit in a protective housing, ensures that the metallic structures have minimum resistivity.

Preferred Hybrid Interconnects Incorporating Low-Capacitance Air Bridges

FIGS. 9 and 10 show two integrated-circuit assemblies which respectively combine the low-capacitance structures of FIGS. 3 and 8 with low-capacitance air bridges to yield new hybrid structures. In particular, FIG. 9 shows an integrated-circuit assembly 40 embodying a coplanar hybrid interconnect system which combines two distinct types of low-capacitance interconnect structures: a first interconnect structure 42 (on the left), and a second interconnect structure 43 (on the right). Structure 42, identical to the previously described structure of FIG. 3, connects transistors 14a and 14b on substrate 12 via conductive vias (or contacts) 16a and 16b and aluminum conductor 22'. For reduced capacitance, conductor 22' is embedded in porous insulation 18" which has a low dielectric constant. Structure 42 is preferably formed as detailed through the above description of FIGS. 1–3.

Interconnect structure 43 comprises an air bridge 44, which in turn comprises an aluminum conductor 44a and air cavity 44b. Conductor 44a, which is substantially coplanar to conductor 22', electrically connects vias 16c and 16d and thus electrically connects corresponding transistors 14c and 14d. The presence of air cavity 44b, which has a unity or near-unity dielectric constant lower than even that of porous insulation 18", minimizes line capacitance between these transistors.

Air bridge 44 is built conventionally by forming conductor 44a on an underlying, sacrificial support structure (not shown) and then removing the support structure to leave air cavity 44b. In conventional processing, the sacrificial support structure consists of photoresist or other material which can be easily dissolved or etched away. For further details on this known process, see U.S. Pat. No. 5,510,645 entitled Semiconductor Structure Having an Air Bridge and Method of Forming the Semiconductor Structure and U.S. Pat. No. 5,324,684 entitled Method of Forming Semiconductor Structure Having an Air Region, both issued to Fitch et al. and both incorporated herein by reference.

Fabrication of air bridge 44 may occur before, after, or concurrent with the fabrication of structure 42. For example, vias 16c and 16d maybe formed simultaneous with vias 16a and 16b or started during the metal substitution reaction that forms conductor 22'. However, one should take care to avoid exceeding the substitution temperature; otherwise undesired substitution of aluminum may occur.

FIG. 10 shows an integrated-circuit assembly 50 embodying a two-level (non-coplanar) hybrid interconnect system which, like assembly 40, combines two types of low-capacitance interconnect structures. Assembly 50 includes an air bridge 54 which connects integrated-circuit assemblies 52 and 53. Assemblies 52 and 53, both of which are structurally identical to the previously described assembly of FIG. 8, embed aluminum conductors 22' in porous insulation 26". Conductors 22" are connected to vias 30', which are electrically connected via air bridge 54.

Air bridge 54 comprises aluminum conductor 54a and air cavity 54b. Conductor 54a, which occupies a plane above that of conductors 22', electrically connects vias 30' and thus electrically connects transistors 14a and 14b to transistors 14c and 14d. Air bridge 54 as well as assemblies 52 and 53 are fabricated according the methods described above.

CONCLUSION

The present invention overcomes at least two significant shortcomings of previous interconnection techniques. First, unlike previous techniques that require digging trenches in an insulative layer before metallization to ensure a coplanar metallic structure, the present invention provides a self-planarizing metallization process, which substitutes metal for select portions of an insulative layer, thereby skipping the time-consuming trench-digging step. Relatedly, the invention forms vias without the conventional steps of etching and filling holes with metal.

Secondly, unlike previous techniques which yielded highly-capacitive interconnective structures, the present invention puts metallic structures in a low-dielectric insulator to form low-capacitance structures which permit integrated circuits to operate with greater speed and economy.

The embodiments described above are intended only to illustrate and teach one or more ways of practicing or implementing the present invention, not to restrict its breadth or scope. The scope of the invention, intended to encompass all ways of practicing or implementing the invention, is defined only by the following claims and their equivalents.

What is claimed is:

1. An integrated-circuit assembly comprising:
   first and second integrated transistors;
   a first layer including first and second conductive regions respectively contacting the first and second integrated transistors;
   a silicon-germanium layer having oxidized and non-oxidized regions, with the non-oxidized region contacting the first conductive region.

2. The integrated-circuit assembly of claim 1, wherein the first layer comprises at least one of a silicon oxide, a silicon nitride, or silicon oxynitride, and each conductive region comprises aluminum.

3. The integrated-circuit assembly of claim 2, wherein the aluminum layer includes copper or silicon.

4. The integrated-circuit assembly of claim 1, wherein the oxidized region includes a germanium oxide which is extractable to form a porous insulative region.

5. The integrated-circuit assembly of claim 1, further comprising:
an aluminum layer contacting at least a portion of the non-oxidized region.

6. The integrated-circuit assembly of claim 1, wherein the silicon-germanium layer has a thickness of approximately one micron.

7. An integrated-circuit assembly comprising:
first and second integrated transistors;
a first layer including first and second conductive regions respectively contacting the first and second integrated transistors;
a silicon-germanium layer having oxidized and non-oxidized regions, with the oxidized region having a portion substantially coplanar with a portion of the non-oxidized region, and with the non-oxidized region contacting the first conductive region.

8. The integrated-circuit assembly of claim 7, wherein the first layer comprises at least one of a silicon oxide, a silicon nitride, or silicon oxynitride, and each conductive region comprises aluminum.

9. The integrated-circuit assembly of claim 7, wherein the oxidized region includes a germanium oxide which is extractable to form a porous insulative region.

10. The integrated-circuit assembly of claim 7, wherein the silicon-germanium layer has a thickness of approximately one micron.

11. The integrated-circuit assembly of claim 7, further comprising: an aluminum layer contacting at least a portion of the non-oxidized region.

12. An integrated-circuit assembly comprising:
first and second integrated transistors;
a first layer including first and second conductive regions respectively contacting the first and second integrated transistors;
a silicon-germanium layer comprising between 10 and 40 percent germanium and having an oxidized and a non-oxidized region, with the oxidized region having a portion substantially coplanar with a portion of the non-oxidized region, and with the non-oxidized region contacting the first conductive region.

13. The integrated-circuit assembly of claim 12, wherein the first layer comprises at least one of a silicon oxide, a silicon nitride, or silicon oxynitride, and each conductive region comprises aluminum.

14. The integrated-circuit assembly of claim 12, wherein the oxidized region includes a geranium oxide which is extractable to form a porous insulative region.

15. The integrated-circuit assembly of claim 12, wherein the silicon-germanium layer has a thickness of approximately one micron.

16. An integrated-circuit assembly comprising:
first and second integrated transistors;
a first layer including first and second conductive regions respectively contacting the first and second integrated transistors;
a silicon-germanium layer comprising between 10 and 40 percent germanium and having an oxidized and a non-oxidized region, with the oxidized region having a portion coplanar with a portion of the non-oxidized region, and with the non-oxidized region contacting the first conductive region,
an aluminum layer contacting at least a portion of the non-oxidized region; and
a zirconium layer contacting the aluminum layer.

17. The integrated-circuit assembly of claim 16, wherein the first layer comprises at least one of a silicon oxide, a silicon nitride, or silicon oxynitride, and each conductive region comprises aluminum.

18. The integrated-circuit assembly of claim 16, wherein the oxidized region includes a germanium oxide which is extractable to form a porous insulative region.

19. The integrated-circuit assembly of claim 16, wherein the silicon-germanium layer has a thickness of approximately one micron and wherein the aluminum layer is between the silicon-germanium layer and the zirconium layer.

20. The integrated-circuit assembly of claim 16, wherein the aluminum layer has a thickness of about 1.5 microns and the zirconium layer has a thickness in a range of 50–250 nanometers.

* * * * *

UNITED STATES PATENT AND TRADEMARK OFFICE
CERTIFICATE OF CORRECTION

| | | |
|---|---|---|
| PATENT NO. | : 6,879,017 B2 | |
| APPLICATION NO. | : 10/338178 | |
| DATED | : April 12, 2005 | |
| INVENTOR(S) | : Ahn et al. | |

It is certified that error appears in the above-identified patent and that said Letters Patent is hereby corrected as shown below:

On page 2, in field (56), under "Other Publications", in column 2, line 5, delete "[0<x( < or x) 0.4]" and insert -- [0<x( < or =) 0.4] --, therefor.

On page 2, in field (56), under "Other Publications", in column 2, line 12, after "Supp." insert -- " --.

On page 2, in field (56), under "Other Publications", in column 2, line 13, after "applications" insert -- " --.

On page 3, in field (56), under "Other Publications", in column 1, line 2, after "Proc." delete ";" and insert -- : --, therefor.

On page 3, in field (56), under "Other Publications", in column 1, line 17, after "GaN" delete "(001)" and insert -- (0001) --, therefor.

On page 3, in field (56), under "Other Publications", in column 1, line 58, after "CA" delete "4/10" and insert -- 4/30 --, therefor.

On page 3, in field (56), under "Other Publications", in column 2, line 3, delete "Melecular" and insert -- Molecular --, therefor.

On page 4, in field (56), under "Other Publications", in column 1, line 17, after "GaN" delete "//" and insert -- / --, therefor.

On page 4, in field (56), under "Other Publications", in column 1, line 36, delete "SIGe" and insert -- SiGe --, therefor.

On page 4, in field (56), under "Other Publications", in column 2, line 11, after "2" delete "." and insert -- , --, therefor.

On page 5, in field (56), under "Other Publications", in column 1, line 7, delete "und" and insert -- and --, therefor.

In column 5, line 26, delete "fonning" and insert -- forming --, therefor.

In column 8, line 26, in Claim 16, after "region" delete "," and insert -- ; --, therefor.

UNITED STATES PATENT AND TRADEMARK OFFICE
CERTIFICATE OF CORRECTION

PATENT NO. : 6,879,017 B2
APPLICATION NO. : 10/338178
DATED : April 12, 2005
INVENTOR(S) : Ahn et al.

It is certified that error appears in the above-identified patent and that said Letters Patent is hereby corrected as shown below:

In column 8, line 46, below "Claim 20" insert
--21. An integrated-circuit assembly comprising: first and second integrated transistors; a first layer including first and second conductive region respectively contacting the first and second integrated transistors; a silicon-germanium layer comprising between 10 and 40 percent germanium and having oxidized and non-oxidized regions, with oxidized region having a portion coplanar with a portion of the non-oxidized region, and with the non-oxidized region contacting the first conductive region; an aluminum layer contacting at least a portion of the non-oxidized region; and a hafnium layer contacting the aluminum layer.

22. The integrated-circuit assembly of claim 21, wherein the first layer comprises at least one of a silicon oxide, a silicon nitride, or silicon oxynitride, and each conductive region comprises aluminum.

23. The integrated-circuit assembly of claim 21, wherein the oxidized region includes a germanium oxide which is extractable to form a porous insulative region.

24. The integrated-circuit assembly of claim 21, where the aluminum layer has a thickness of about 1.5 microns and the hafnium layer has a thickness in a range of 50-250 nanometers.

25. The integrated-circuit assembly of claim 21, wherein the silicon-germanium layer has a thickness of approximately one micron and wherein the aluminum layer is between the silicon-germanium layer and the hafnium layer. --.

Signed and Sealed this

Eighteenth Day of September, 2007

JON W. DUDAS
*Director of the United States Patent and Trademark Office*